(12) United States Patent
D'Angelo

(10) Patent No.: US 10,613,140 B2
(45) Date of Patent: *Apr. 7, 2020

(54) FAULT DETECTION CIRCUIT FOR A PWM DRIVER, RELATED SYSTEM AND INTEGRATED CIRCUIT

(71) Applicant: STMicroelectronics S.r.l., Agrate Brianza (IT)

(72) Inventor: Giuseppe D'Angelo, Tufino (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 16/244,954

(22) Filed: Jan. 10, 2019

(65) Prior Publication Data

US 2019/0146034 A1 May 16, 2019

Related U.S. Application Data

(63) Continuation of application No. 15/389,335, filed on Dec. 22, 2016, now Pat. No. 10,197,625.

(30) Foreign Application Priority Data

May 16, 2016 (IT) .................. 102016000049920

(51) Int. Cl.
*G01R 31/317* (2006.01)
*H03K 7/08* (2006.01)
(Continued)

(52) U.S. Cl.
CPC ... *G01R 31/31703* (2013.01); *G01R 31/3181* (2013.01); *H03K 7/08* (2013.01);
(Continued)

(58) Field of Classification Search
CPC .......... G01R 31/31703; G01R 31/3181; H03K 7/08; H03K 17/22; H03K 19/007; H03K 21/38
(Continued)

(56) References Cited

U.S. PATENT DOCUMENTS 5,594,631 A 1/1997 Katoozi et al.
9,660,632 B1 * 5/2017 Melanson ................ H03K 7/08
(Continued)

OTHER PUBLICATIONS

STMICROELECTRONICS, "Safety application guide for SPC56xL70xx family," Application note, AN4266, Doc ID 024283, Rev. 2, Sep. 17, 2013, 76 pages.

*Primary Examiner* — Melissa J Koval
*Assistant Examiner* — Trung Nguyen
(74) *Attorney, Agent, or Firm* — Slater Matsil, LLP

(57) ABSTRACT

Fault detection circuitry and a corresponding method are disclosed. A count value that is indicative of the switching period of a PWM signal is determined and it is determined whether this count value is between a first threshold and a second threshold. An error signal is generated when the switching period is not between the first and the second threshold. A count value that is indicative of the switch-on duration of the PWM signal is determined and compared with a switch-on threshold in order to determine whether the switch-on duration is greater than a maximum switch-on duration. A count value that is indicative of the switch-off duration of the PWM signal is determined and compared with a switch-off threshold in order to determine whether the switch-off duration is greater than a maximum switch-off duration. Error signals can be generated when the durations are greater than the maximum durations.

21 Claims, 10 Drawing Sheets

(51) Int. Cl.
     *H03K 19/007*    (2006.01)
     *G01R 31/3181*   (2006.01)
     *H03K 17/22*     (2006.01)
     *H03K 21/38*     (2006.01)

(52) U.S. Cl.
     CPC ........... *H03K 17/22* (2013.01); *H03K 19/007*
                     (2013.01); *H03K 21/38* (2013.01)

(58) Field of Classification Search
     USPC ....... 324/326, 337, 379, 323, 500, 512, 528,
                 324/66, 250, 754.06, 754.31, 637, 645,
                 324/76.12, 76.14, 76.56, 84, 95, 631;
                 327/172–175, 160, 31, 142, 141, 231, 232
     See application file for complete search history.

(56)               References Cited

U.S. PATENT DOCUMENTS

| 2009/0067487 | A1  | 3/2009  | Diewald              |
| 2013/0334877 | A1  | 12/2013 | Yamaguchi            |
| 2016/0285448 | A1* | 9/2016  | Fugere ........ H03K 17/165 |
| 2017/0063364 | A1  | 3/2017  | Scorrano et al.      |
| 2017/0222638 | A1  | 8/2017  | Gariboldi            |

* cited by examiner

FAULT DETECTION CIRCUIT FOR A PWM DRIVER, RELATED SYSTEM AND INTEGRATED CIRCUIT

CROSS-REFERENCE TO RELATED APPLICATIONS

The present application is a continuation of U.S. patent application Ser. No. 15/389,335, filed Dec. 22, 2016, which claims priority to Italian Application No. 102016000049920, filed on May 16, 2016, which applications are hereby incorporated by reference herein in their entirety.

TECHNICAL FIELD

Embodiments of the present disclosure relate to solutions for detecting a fault of a Pulse Width Modulated (PWM) driver.

BACKGROUND

In automotive applications the use of Direct Current (DC) or Brushless DC (BLDC) motors for fan, pump or actuator applications is very common with the trend of replacing the traditional DC with BLDC motors. In most automotive applications, detection of fault conditions of the BLDC motor and the control electronics is mandatory. For this reason, the control electronics should be able to identify a possible fault condition and then apply counter measures, e.g., in order to protect the system. Often the detected fault condition is reported to a system controller and may be accessible via the diagnosis interface of the automobile for further service investigations.

As disclosed, e.g., in document IT102016000009376, a motor is often driven using one or more half-bridges as a function of one or more respective PWM signals.

For example, FIG. 1 shows a typical half-bridge arrangement 20 comprising two electronic switches $SW_1$ and $SW_2$, such as n-channel power MOSFETs (Metal-Oxide-Semiconductor Field-Effect Transistor), connected in series between a supply voltage Vdd and a ground GND.

Usually, the switches $SW_1$ and $SW_2$ are closed alternatively in order to connect the output OUT of the half-bridge arrangement 20, i.e., the intermediate point between the switches $SW_1$ and $SW_2$, either to the voltage Vdd or to ground GND.

For this purpose, the half-bridge is driven as a function of two drive signals $DRV_1$ and $DRV_2$, which are connected (e.g., directly) to the control gates of the switches $SW_1$ and $SW_2$, respectively.

Specifically, in order to correctly drive the control gates, usually a high-side driver $200_1$ is used to generate the drive signal $DRV_1$ for the high-side switch $SW_1$ as a function of a first control signal $IN_1$, and a low-side driver $200_2$ is used to generate the drive signal $DRV_2$ for the low-side switch $SW_2$ as a function of a control signal $IN_2$.

The control signal $IN_2$ corresponds often to an inverted version of the signal $IN_1$ (or vice versa), i.e., the signal $IN_2$ is low when the signal $IN_1$ is high and vice versa. For example, in FIG. 1 is used an inverter 202 which receives at input the signal $IN_1$ and provides at output the signal $IN_2$.

The output OUT of the half-bridge arrangement 20 may be used to drive a load. For example, in FIG. 1, the half-bridge arrangement 20 drives a motor $M_1$ connected between the output OUT of the half-bridge arrangement 20 and ground GND.

Conversely, FIG. 2 shows an example in which two half-bridge arrangements $20_a$ and $20_b$ are used to drive a linear motor $M_2$, such as a voice coil motor, connected between the output $OUT_a$ of the first bridge arrangement $20_a$ and the output $OUT_b$ of the second bridge arrangement $20_b$. As well known to those of skill in the art, in this case, also the rotation direction of the motor $M_2$ may be controlled by applying appropriate control signals $IN_a$ and $IN_b$ to the half-bridge arrangements $20_a$ and $20_b$.

Finally, FIG. 3 shows an example in which three half-bridge arrangements $20_a$, $20_b$ and $20_c$ are used to drive a three phase motor $M_3$, such as a spindle motor, connected between the outputs $OUT_a$, $OUT_b$ and $OUT_c$ of the half-bridge arrangements $20_a$, $20_b$ and $20_c$.

As mentioned before, the control signals may be PWM signals, i.e., signals with a fixed frequency and a variably duty cycle. For example, document IT102015000046790 discloses a solution for generating two PWM signals which may be used, e.g., for generating the signals $IN_a$ and $IN_b$ in the solution shown in FIG. 2.

FIG. 4 shows in this regards a typical PWM signal PWM, such as the signal IN, corresponding to a pulsed signal comprising a single pulse P for each switching cycle with duration or period $T_{PWM}$, wherein the switch-on duration $T_{ON}$ of the pulse P may be variable as a function of a control signal.

Generally, the pulse P is not necessarily at the beginning of each switching cycle, but each switching cycle may comprise an initial switch-off period $T_{OFF1}$ before the pulse P and a final switch-off period $T_{OFF2}$ after the pulse P, with:

$$T_{PWM}=T_{OFF1}+T_{ON}+T_{OFF2} \qquad (1)$$

with the switch-off duration $T_{OFF}$ being:

$$T_{OFF}=T_{OFF1}+T_{OFF2} \qquad (2)$$

wherein the duty cycle D of each switching cycle is given by:

$$D=T_{ON}/T_{PWM} \qquad (3)$$

Accordingly, e.g., for an advanced automotive application, the diagnoses of control electronics should include a detection circuit configured to detect PWM hardware failures.

FIGS. 5a and 5b shows typical PWM hardware failures. Specifically, FIG. 5a shows the desired or requested PWM signal $PWM_R$ comprising four pulses P1-P4 and FIG. 5b shows the generated signal PWM. In the example considered, the third pulse P3 has a different duty cycle and the fourth pulse P4 is missing.

In order to detect such PWM failures, two known solutions can be used.

FIG. 6 shows the first solution, wherein a redundancy control is performed.

Specifically, in the example considered, a first PWM signal generator $30_1$ is used to generate a first PWM signal $PWM_1$, such as the signals IN described with respect to FIGS. 1 to 3, which may be used to drive a half-bridge arrangement 20.

The circuit comprises moreover a second PWM signal generator $30_2$ configured to generate a second PWM signal $PWM_2$, wherein both PWM signal generators $30_1$ and $30_2$ are redundant, i.e., use the same configuration and thus should generate the same PWM signals.

In the example considered, an additional redundancy control checking unit 32, often in the form of a dedicated hardware module, is used to verify whether the signals PWM₁ and PWM₂ correspond, and possibly generates a failure signal FS when a mismatch is detected.

Conversely FIG. 7 shows the second solution. In this case a single PWM signal generator 30 is used to generate a PWM signal PWM.

In the example considered, the signal PWM is provided to a read-back module 34, often in the form of a dedicated hardware module, which determines the characteristics of the PWM signal, such as the switching period $T_{PWM}$ and the switch-on time $T_{ON}$.

These characteristics are provided to a further module 36, such as a software module, which verifies whether the characteristics requested correspond to the generated characteristics provided by the read-back module 34, and possibly generates a failure signal FS when a mismatch is detected.

The above solutions are described, e.g., in the application note AN4266—"Safety application guide for SPC56xL70xx family", STMicroelectronics, September 2013.

SUMMARY

The inventor has observed that the solutions described in the background section have several drawbacks.

With regards to the first solution (see FIG. 6), in order to exploit redundancy, the PWM hardware channel PW₁, and the redundant one PW₂ should belong to independent modules in order to decrease the probability of CCFs (Common Cause Faults) and the comparison at the module 32 should be demanded to an additional dedicated hardware. Thus, while this solution permits to detect PWM hardware failures immediately, the solution has a significant drawback in terms of device size and cost.

With regards to the second solution (see FIG. 7), a single additional dedicated hardware 34 with read-back feature is sufficient in order to have available the required read-back characteristics. As a result, implementing this solution affects less significantly the device size. However, the type of failure may often not be detected, such as in case of short circuit to ground or to power supply, or in case the PWM module 30 is not working at all. Moreover, the detection of a failure is often not immediate but depends on the type of failure and the latency of the circuit 34 and the execution time of the (software) module 36.

In view of the above, embodiments of the present disclosure provides solutions that overcome one or more of the above drawbacks.

According to one or more embodiments, a fault detection circuit for a PWM driver is provided. Embodiments moreover concern a related system and integrated circuit.

As mentioned before, the present disclosure relates to a fault detection circuit for a PWM driver configured to generate a PWM signal having a given switching period, switch-on duration and switch-off duration.

In various embodiments, the fault detection circuit comprises a first sub-circuit configured to determine a count value being indicative of the switching period of the PWM signal. For example, in various embodiments, the first sub-circuit comprises a counter and a respective counter reset circuit configured to reset the counter once for each PWM cycle of the PWM signal. For example, the counter reset circuit may receive from the PWM driver a PWM period signal comprising a pulse when a new PWM cycle starts, or the counter reset circuit may reset the counter at each rising or alternatively at each falling edge of the PWM signal.

In various embodiments, the first sub-circuit tests whether the count value being indicative of the switching period is between a first and a second threshold and generates one or more error signals when the switching period is not between these thresholds. In various embodiments, the thresholds are stored in a programmable memory.

In various embodiments, the fault detection circuit comprises a second sub-circuit. The second sub-circuit determines a count value being indicative of the switch-on duration of the PWM signal and a count value being indicative of the switch-off duration of the PWM signal. Next, the second sub-circuit compares the count value being indicative of the switch-on duration with a switch-on threshold in order to determine whether the switch-on duration is greater than a maximum switch-on duration and possibly generates a switch-on error signal when the switch-on duration is greater than the maximum switch-on duration. Similarly, the second sub-circuit compares the count value being indicative of the switch-off duration with a switch-off threshold in order to determine whether the switch-off duration is greater than a maximum switch-off duration and possibly generates a switch-off error signal when the switch-off duration is greater than the maximum switch-off duration. Again, these thresholds may be stored in a programmable memory.

For example, in various embodiments, the second sub-circuit uses the same counter in order to determine the count value being indicative of the switch-on duration and the count value being indicative of the switch-off duration, i.e., the second sub-circuit comprises one counter configured to generate one count value, wherein this count value is indicative of the switch-on duration when the PWM signal is high and indicative of the switch-off duration when the PWM signal is low. In this case, the second sub-circuit may comprise a respective counter reset circuit configured to reset this counter at each rising and each falling edge of the PWM signal.

For example, in various embodiments, the mentioned counter is an up-and-down counter configured to increase the respective count value when the PWM signal has a first logic level, e.g., is high, and decrease the count value when the PWM signal has a second logic level, e.g., is low.

In various embodiments, the second sub-circuit may thus comprise two comparators. The first comparator generates the switch-on error signal by comparing the count value with the switch-on threshold and the second comparator generates the switch-off error signal by comparing the count value with the switch-off threshold.

BRIEF DESCRIPTION OF THE DRAWINGS

Embodiments of the present disclosure will now be described with reference to the annexed drawings, which are provided purely by way of non-limiting example and in which.

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

In the following FIGS. 8 to 19 parts, elements or components which have already been described with reference to FIGS. 1 to 7 are denoted by the same references previously used in such Figures; the description of such previously described elements will not be repeated in the following in order not to overburden the present detailed description.

As mentioned in the foregoing, the present disclosure relates to a fault detection circuit for a PWM signal generator.

Figure 8:
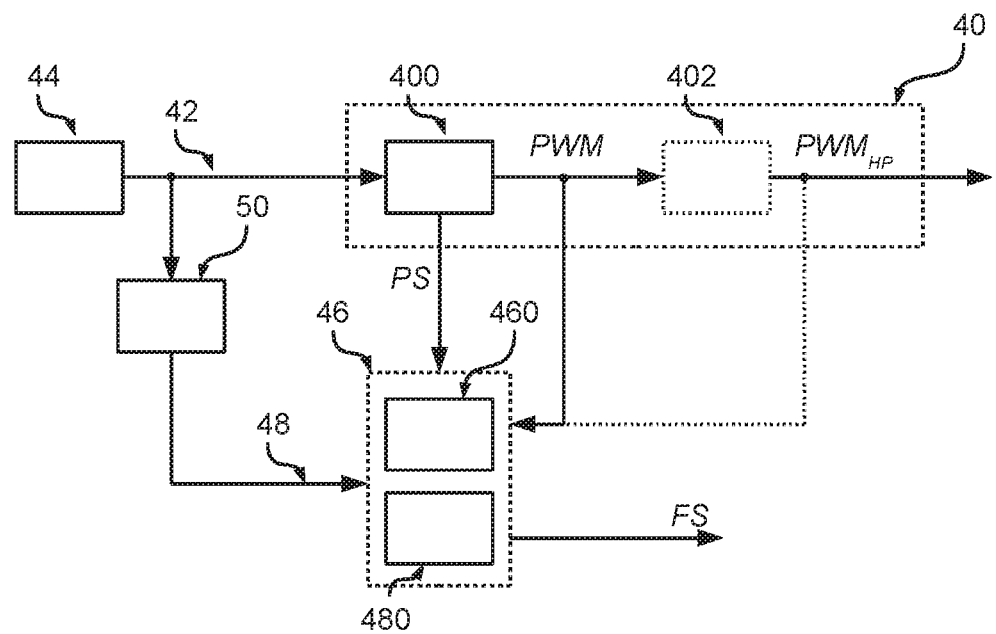
FIG. 8 shows an embodiment of a PWM driver and a respective fault detection circuit comprising two sub-circuits.

FIG. 8 shows the general architecture of a PWM system in accordance with the present disclosure.

In the embodiment considered, the system comprises a PWM driver 40 and a fault detection circuit 46.

Figure 4:
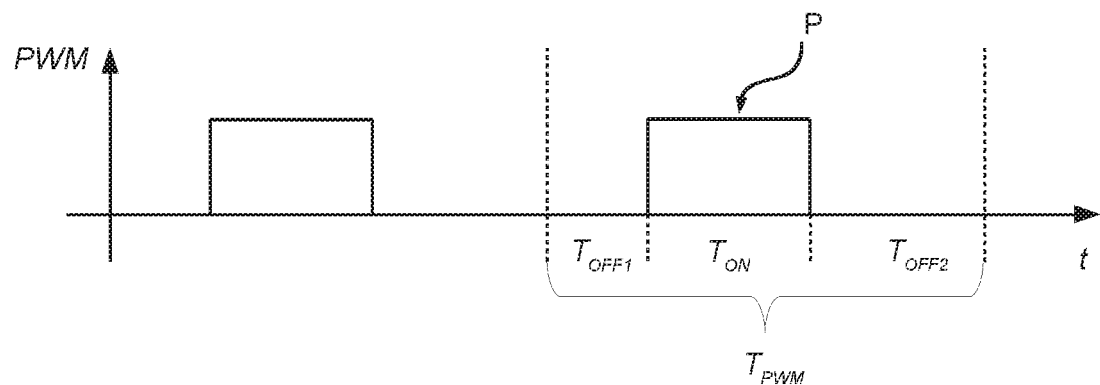
FIG. 4 show a typical PWM signal.
Figure 5A:
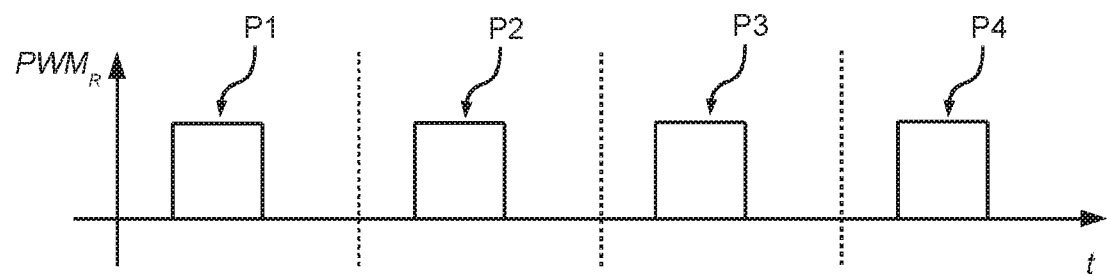
FIGS. 5a and 5b show typical PWM failures.
Figure 5B:
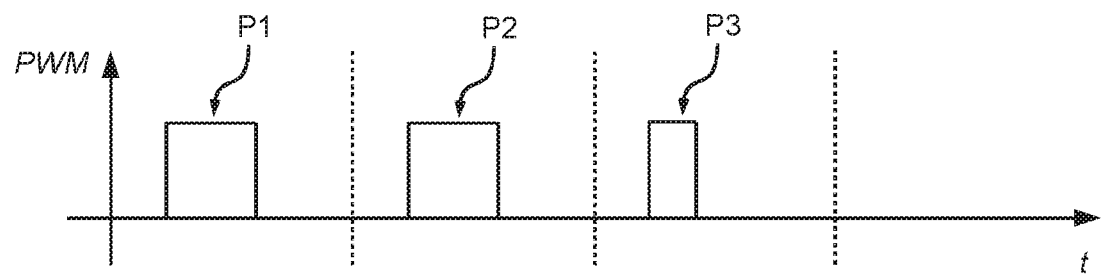
Figure 6:
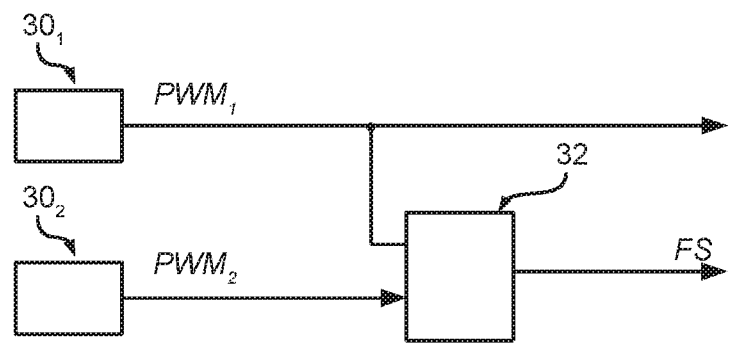
FIGS. 6 and 7 show prior-art solutions for detecting a PWM failure.
Figure 7:
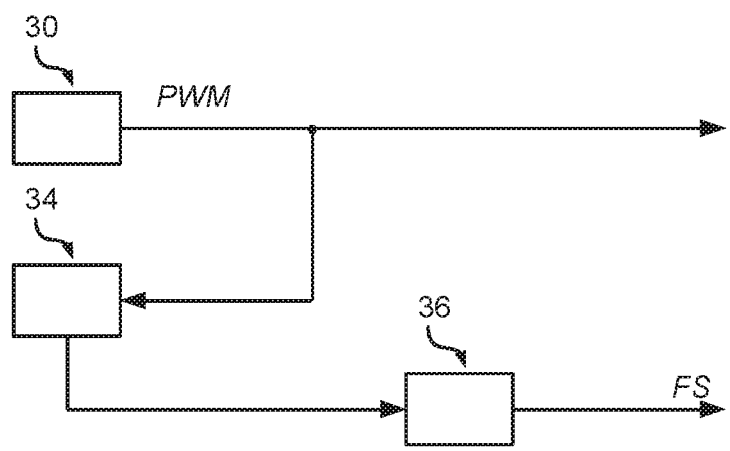

In various embodiments, the PWM driver 40 comprise at least a PWM signal generator 400, such as the module 30 described in the foregoing, such as a configurable hardware module or a software programmed microprocessor, generating a PWM signal PWM having a given frequency and duty cycle (see also, the description with respect to FIG. 4).

In various embodiments, the PWM signal generator 400 is configured to generate a low power PWM signal PWM, e.g., a signal with a maximum voltage between 3.0 and 5 V and maximum current below 100 mA. In this case, the PWM signal generator circuit 40 may also comprise a driver circuit 402 configured to convert the low power PWM signal PWM provided by the circuit 400 in a higher power signal $PWM_{HP}$, i.e., a signal having a higher maximum voltage and/or maximum current. For example, in various embodiments, the driver circuit 402 may comprise a half-bridge arrangement 20 (see e.g., FIG. 1).

In various embodiments, the PWM driver 40, in particular the PWM signal generator 400, is configured to generate the signal PWM as a function of one or more control signals 42 indicating one or more requested characteristics of the signal PWM. For example, in the embodiment considered, the one or more control signals 42 are generated by a control unit 44. For example, these control signal(s) 42 may indicate only the duty cycle or switch-on period $T_{ON}$ and the switching period $T_{PWM}$ may be constant. In alternative or in addition, the control signal(s) 42 may indicate the switching period $T_{PWM}$. In various embodiments, the control signal(s) 42 may also vary for each PWM cycle.

For example, in various embodiments considered, the control unit 44 may be a software programmed microprocessor of a microcontroller and the low power signal generator 400 and possibly the driver 402 may be a dedicated hardware module of the same microcontroller. For example, in this case, the operation of the PWM signal generator circuit 40 may be controlled via so called Special Function Registers (SFR) of this microcontroller.

In the embodiment considered, the system comprises moreover a fault detection circuit 46. In various embodiments, also the fault detection circuit 46 may be a hardware module of the microcontroller comprising the control unit 44 and/or the PWM driver 40.

Figure 9:
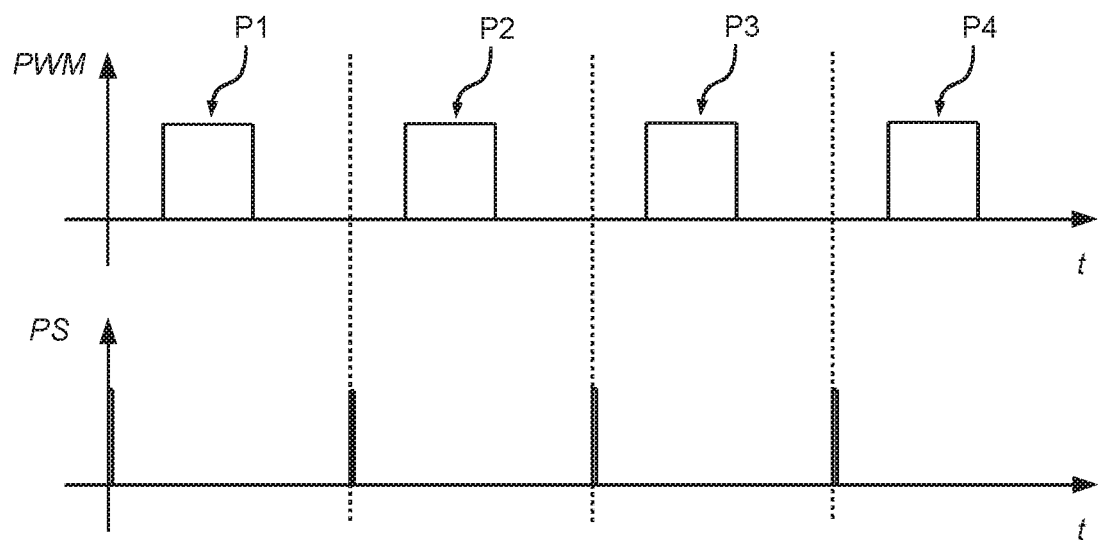
FIG. 9 shows an example of the signals generated by the PWM driver of FIG. 8.

In the embodiment considered, the fault detection circuit 46 receives a PWM period signal PS, e.g., a series of pulses with a period equals to the period $T_{PWM}$, generated by the PWM driver 40, e.g., by the circuit 400. As shown in FIG. 9, the PWM period signal PS may indicate the start of each PWM cycle or period and may correspond to a pulsed signal being set, e.g., to "high" for one or more clock cycles when a new PWM cycle starts.

Figure 1:
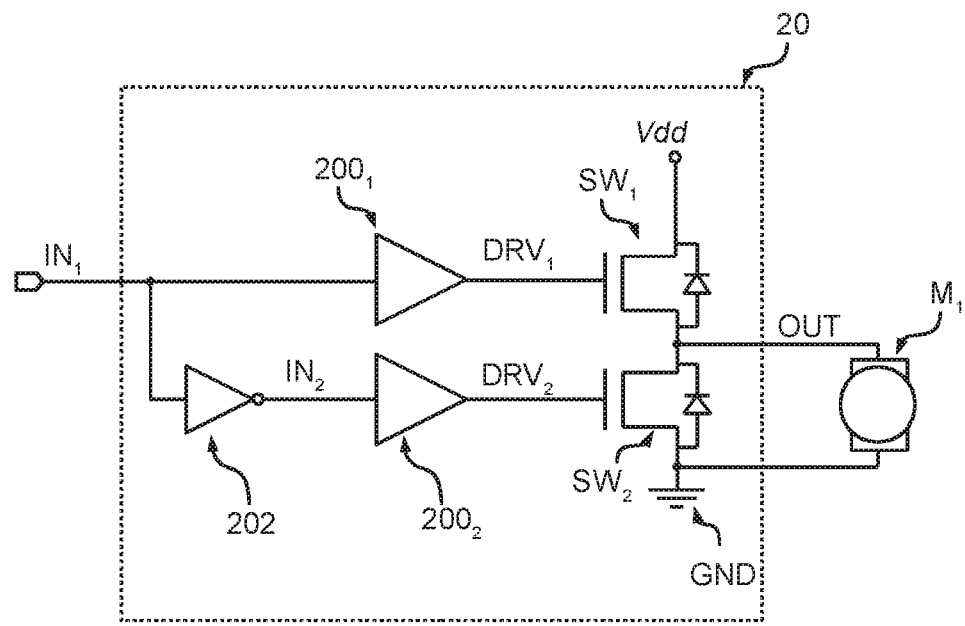
FIGS. 1, 2 and 3 shows solutions for driving a motor.
Figure 2:
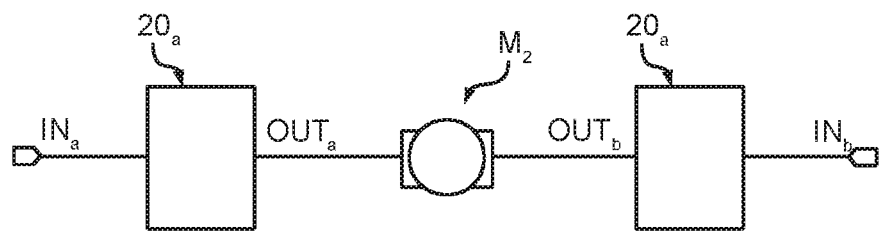
Figure 3:
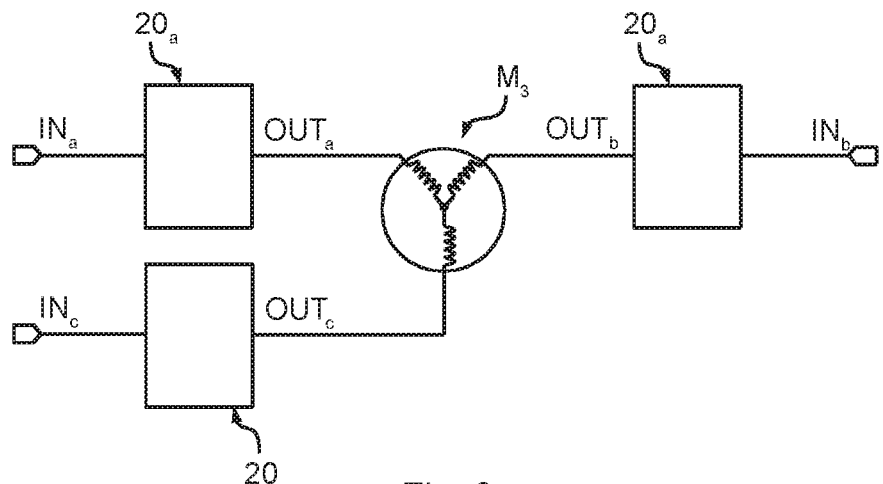

In the embodiment considered, the fault detection circuit 46 receives moreover one of the PWM signals generated by the PWM signal generator 40, such as the low power signal PWM or the high-power signal $PWM_{HP}$, e.g., one of the signal IN, $DRV_1/DRV_2$ or OUT shown in FIG. 1.

In various embodiments, the PWM period signal PS may be routed internally to the fault detection circuit 46 and the PWM output signal PWM/$PWM_{HP}$ may be externally routed (e.g., via an external connection of the pins of the microcontroller) to the fault detection circuit 46. Such an external routing may be requested by safety requirements to cover also package faults.

In various embodiments, the fault detection circuit 46 moreover receives one or more control signals 48 indicating one or more fault detection characteristics. In the embodiment considered, the control signal(s) 48 are generated by a block 50 configured to determine the control signal(s) 48 indicating the fault detection characteristics as a function of the control signal(s) 42 indicating one or more requested characteristics of the PWM signal. For example, the block 50 may be a dedicated hardware module, such as a dedicated hardware model of the microcontroller comprising the control unit 44, or a software module of the control unit 44.

In various embodiments, the fault detection circuit 46 comprises two submodules 460 and 480. The first submodule 460 is configured to analyses the switching period $T_{PWM}$ of the signal PWM. Conversely, the second submodule 480 is configured to analyses the switch-on and switch-off periods of the signal PWM.

Figure 10:
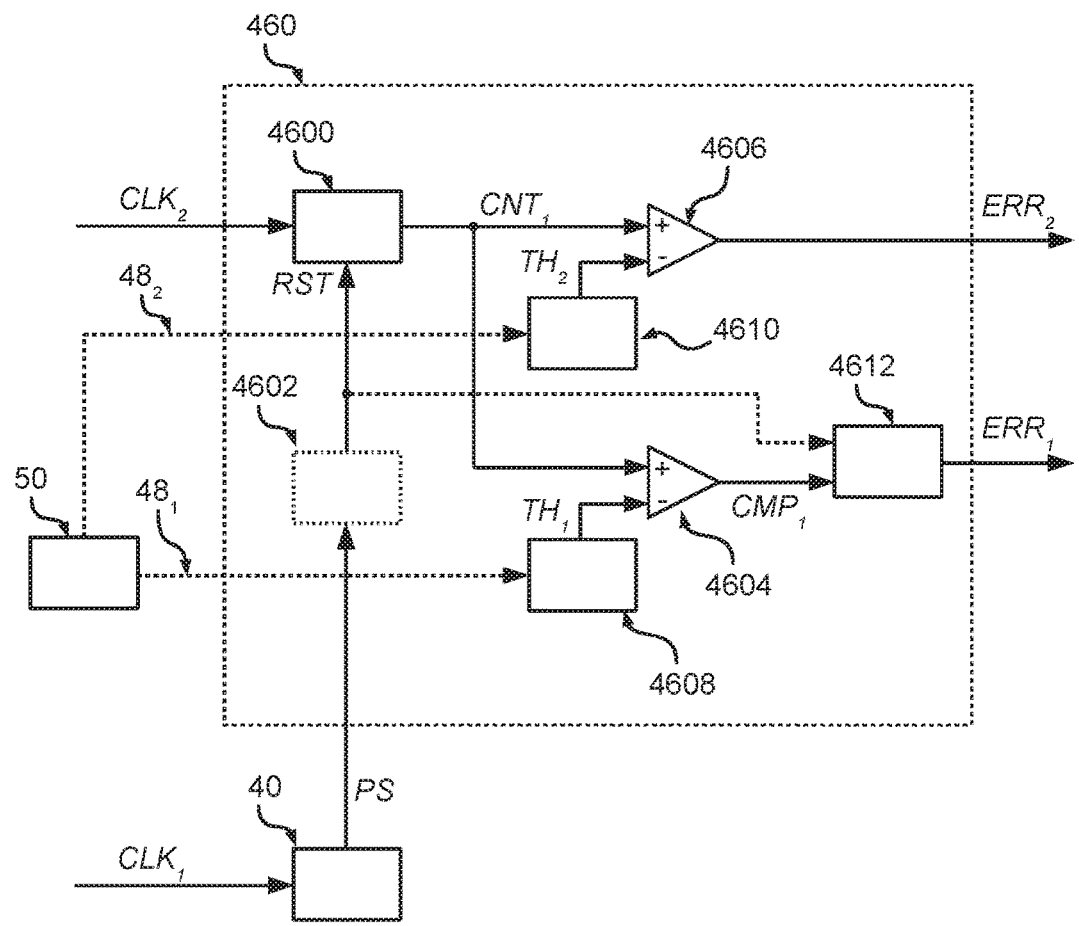
FIGS. 10 an 11 show an embodiment of the first sub-circuit of the fault detection circuit of FIG. 8.

FIG. 10 shows a first embodiment of the submodule 460.

In the embodiment considered, the PWM driver 40, in particular the low power signal generator 400, is driven using a first clock signal $CLK_1$. Conversely, the submodule 460 is driven using a second clock signal $CLK_2$. Generally, the clock signals $CLK_1$ and $CLK_2$ may also be the same clock signal, e.g., the clock signal of the control unit 44.

As mentioned in the foregoing, the submodule 460 is configured to analyses the switching period $T_{PWM}$ of the signal PWM. For this reason, the submodule 460 is configured to determine by means of the signal PS whether the duration of the PWM period is within given limits.

Specifically, in the embodiment considered, the submodule 460 comprises a digital counter 4600 and a counter reset circuit 4602. More specifically, in the embodiment considered, the counter reset circuit 4602 is configure to generate a reset signal RST adapted to reset the counter 4600 when the signal PS indicates that a new PWM cycle has started. Generally, this circuit 4602 is purely optional, because the signal PS could already correspond to a signal being adapted to reset the counter 4600, such as a signal being set to high only for short period, such as one clock cycle, at the beginning of each PWM cycle. Accordingly, the counter 4600 is configured to vary (i.e., increase or decrease depending on the type of counter used) a count value $CNT_1$ at each clock event of the clock signal $CLK_2$ and reset the count value $CNT_1$ when the signal PS indicates the start of a new PWM cycle.

In the embodiment considered, the submodule 460 comprises also two comparators 4604 and 4606 configured to compare the count value $CNT_1$ of the counter 4600 with a first threshold $TH_1$ and a second threshold $TH_2$, respectively. For example, these thresholds $TH_1$ and $TH_2$ may be stored in respective registers 4608 and 4610, and the content of these registers may be programmed via the block 50 via respective signals $48_1$ and $48_2$.

Figure 11:
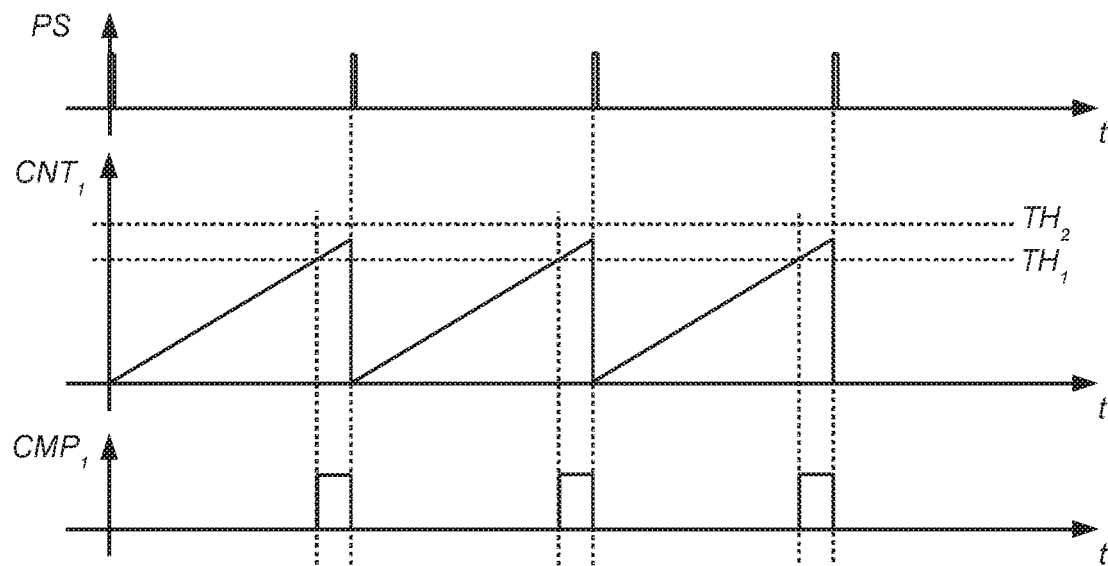

FIG. 11 shows an embodiment of the operation of the submodule 460, wherein a synchronous up-counter 4600 is used. Accordingly, in the embodiment considered, the counter 4600 is configure to reset the count value $CNT_1$ as a function the signal PS at the beginning of each PWM cycle and then increase the count value $CNT_1$ in accordance with the clock signal $CLK_2$. Moreover, when the count value $CNT_1$ is greater than the threshold $TH_1$, the comparator 4604 will change the respective output signal $CMP_1$, e.g., set the output $CMP_1$ of the comparator 4604 to high. Similarly, when the count value $CNT_1$ is greater than the threshold $TH_2$, the comparator 4606 will change the respective output signal.

As shown in FIG. 11, in case the PWM period is correct, the output of the comparator 4604 should be high and the output of the comparator 4606 should be low when a new PWM cycle starts, i.e., the count value $CNT_1$ should be greater than the first threshold $TH_1$, but smaller than the second threshold $TH_2$. Accordingly, the block 50 should set the content of the registers 4608 and 4610 in order to satisfy these conditions. For example, in various embodiment the block 50 may be configured to set the registers 4608 and 4610 according to the following relations:

$$TH_1 = C_{PWM\_CLOCK} - X_1 \quad (4)$$

$$TH_2 = C_{PWM\_CLOCK} + X_2 \quad (5)$$

where $C_{PWM\_CLOCK}$ corresponds to the PWM period $T_{PWM}$ in number of clock cycles of the clock signal $CLK_2$, and $X_1$ and $X_1$ are one or more clock cycle of the same clock representing the tolerance accepted for the PWM period $T_{PWM}$.

Accordingly, when the PWM period is correct, the count value $CNT_1$ should be between the first threshold $TH_1$ and the second threshold $TH_2$ at the end of each PWM cycle, i.e., when the counter 4600 is reset.

Conversely, when the count value $CNT_1$ reaches the second threshold $TH_2$ during a PWM cycle, i.e., before the counter 4600 is reset, the PWM cycle is too long and an error should be created. For example, in the embodiment considered, this may be achieved by using the output of the comparator 4606 as an error signal $ERR_2$ indicating that the PWM period is too long.

Conversely, the PWM period is too short, when the count value $CNT_1$ does not reach the first threshold $TH_1$ during a PWM cycle, i.e., before the counter 4600 is reset. For example, in the embodiment considered this is achieved by means of a verification circuit 4612, which receives at input the reset signal RST from the counter reset circuit 4602 (or possibly the signal PS) and the comparison signal from the comparator 4604. In particular, this verification circuit 4612 is configured to generate an error signal $ERR_1$, indicating that the count value $CNT_1$ was smaller than the first threshold $TH_1$ when a new PWM period started, i.e., when a new reset of the counter 4600 occurred.

In various embodiments, once having detected an error, the sub-circuit 460 may store the value of the error signals $ERR_1$ and/or $ERR_2$ in a memory, such as register or flip-flop. For example, in various embodiments, each error signal is connected to the set input of a set-reset flip-flop or latch.

Figure 12:
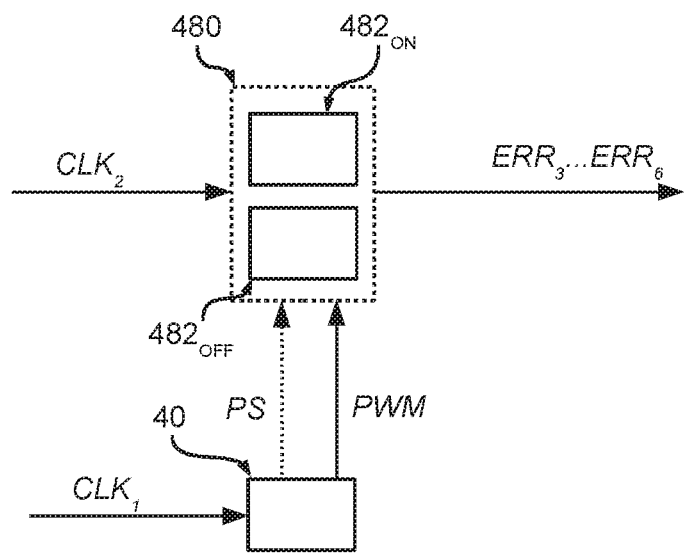
FIG. 12 show a first embodiment of the second sub-circuit of the fault detection circuit of FIG. 8.

FIG. 12 shows a first embodiment of the submodule 480.

As mentioned before, the second submodule 480 is configured to analyses the switch-on and switch-off durations of the PWM signal.

In the embodiment considered, the submodule 480 comprises two circuits $482_{ON}$ and $482_{OFF}$ configured to determine respectively whether the switch-on and switch-off durations of the PWM period are within given limits.

In the embodiments considered, the circuit $482_{ON}$ and $482_{OFF}$ have substantially the architecture of the circuit 460 shown in FIG. 10.

Figure 13:
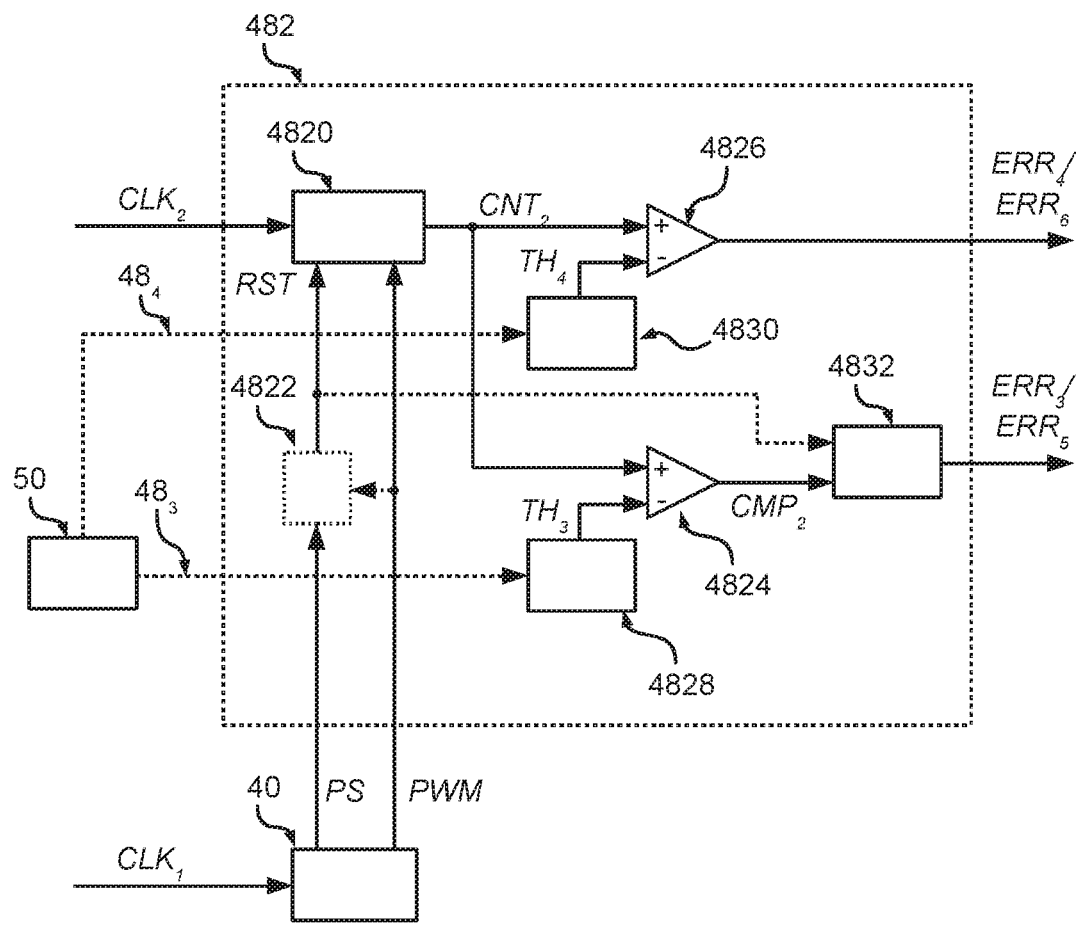
FIGS. 13, 14 and 15 show possible embodiments of the second sub-circuit of FIG. 12.

FIG. 13 shown in this regards a generic circuit 482 which may be used for both circuits $482_{ON}$ and $482_{OFF}$. Specifically, also in this case, the circuit 482 comprises a counter 4820 (possibly having associated therewith a counter reset circuit 4822), two comparators 4824 and 4826 (possibly having associated therewith a respective threshold registers 4828 and 4830), and a verification circuit 4832. Specifically, the circuit operate similar to the submodule 460, with the only difference that the counter 4820 is enabled either when the PWM signal is high (for the circuit $482_{ON}$) or when the PWM signal is low (for the circuit $482_{OFF}$).

Accordingly, similar to the circuit 460, the counter 4820 will be reset at each new PWM period and the counter 4820 will vary (increase or decrease) the count value $CNT_2$ of the counter 4820 at each clock cycle. However, in this case, the counter 4820 is only enabled when the PWM signal is high (for the circuit $482_{ON}$) or low (for the circuit $482_{OFF}$), i.e., the count value $CNT_2$ is indicative of the switch-on/switch-off duration of the signal PWM. Accordingly, similar to the circuit 460, this count value may be compared at the comparators 4824 and 4826 with two threshold values $TH_3$ and $TH_4$.

For example, in case of the circuit $482_{ON}$, the comparator 4826 will generate an error signal $ERR_4$ when the count value $CNT_2$ is greater than the threshold $TH_4$, thereby indicating that the switch-on duration was too long. Conversely, the verification circuit 4832 is configured to generate an error signal $ERR_5$ when the count value $CNT_2$ was smaller than the first threshold $TH_3$ and a new PWM period started, thereby indicating that the switch-on duration was too short.

Similarly, in case of the circuit $482_{OFF}$, the comparator 4826 will generate an error signal $ERR_6$ when the count value $CNT_2$ is greater than the threshold $TH_4$, thereby indicating that the switch-off duration was too long. Conversely, the verification circuit 4832 is configured to generate an error signal $ERR_5$ when the count value $CNT_2$ was smaller than the first threshold $TH_3$ and a new PWM period started, thereby indicating that the switch-off duration was too short.

Generally, instead of using the PWM period signal PS, the counter reset circuit 4822 may also operate with the signal PWM in order to detect a new PWM period. For example, in this case, the counter reset circuit 4822 may detect the rising edges (or alternatively the falling edges) in the signal PWM in order to reset the counter 4820. This embodiment permits thus to detect spikes in the signal PWM, because such spikes will reset the counter 4820. The same applies also to the counter reset circuit 4602 of the circuit 460. Accordingly, in general, the signal PS is purely optional.

Figure 14:
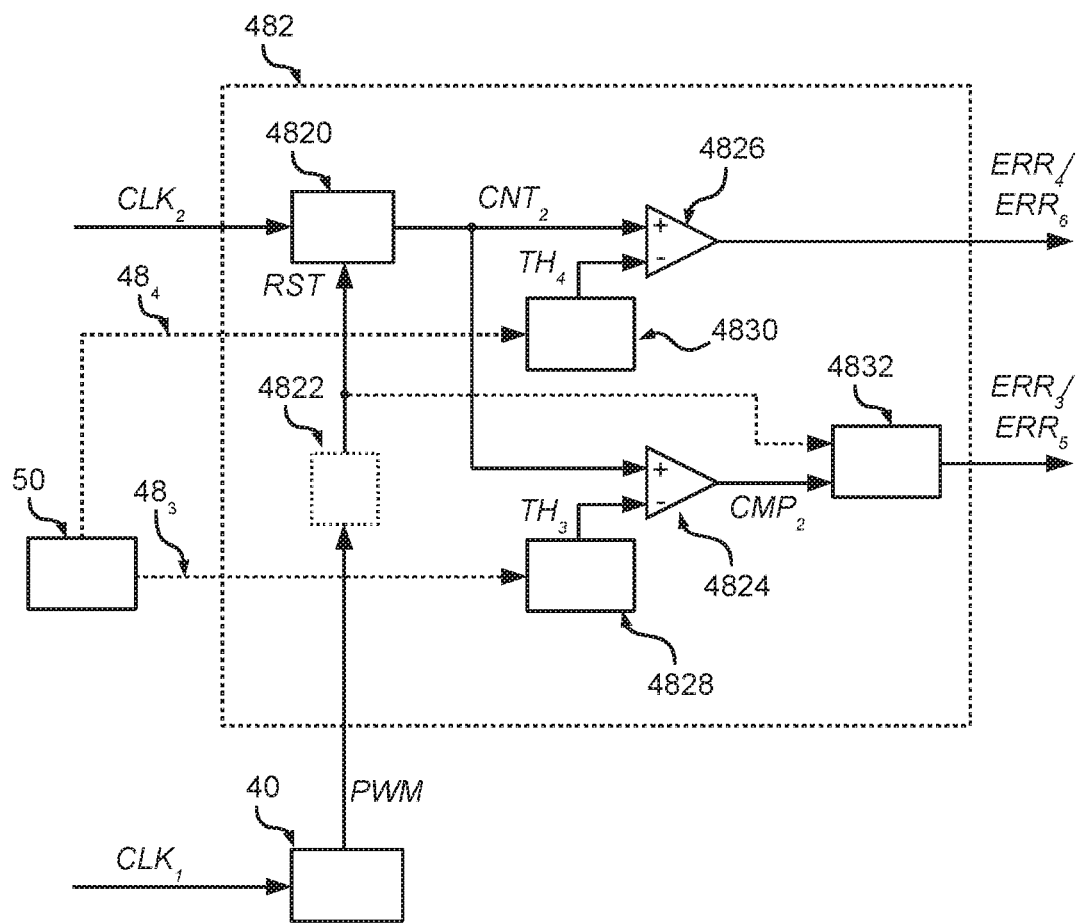

FIG. 14 shows a second embodiment of the circuit 482, in which the reset signal RST provided by the circuit 4822 corresponds directly to the PWM signal (for the circuit 482$_{OFF}$) or to the inverted PWM signal (for the circuit 482$_{ON}$). In this case, the counter 4820 does also not require an enable port.

Figure 15:
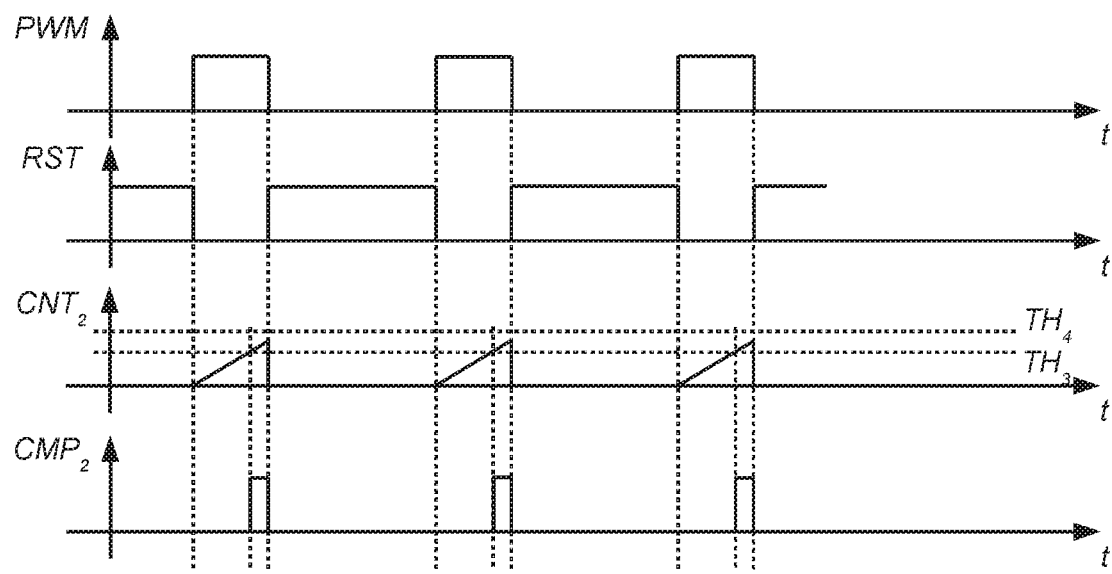

In fact, as shown in FIG. 15 at the example of the circuit 482$_{ON}$, the reset signal will maintain the counter 4820 reset when the PWM signal is low and the counter 4820 will start to count when the signal PWM is high. Accordingly, the verification circuit 4832 may determine whether the comparison signal CMP2 at the output of the comparator 4824 is set at the next rising edge of the reset signal RST.

The above embodiments do, however, not take into account that indeed a relationship exists between the switch-on duration and the switch-off duration. In fact, assuming that the duration $T_{PWM}$ of the PWM cycle is correct (which is already verified by the circuit 460), a too long switch-on duration $T_{ON}$ (signal $ERR_4$ is set) will automatically imply a too short switch-off duration $T_{OFF}$ (signal $ERR_5$ is set) and similarly a too short switch-on duration $T_{ON}$ (signal $ERR_3$ is set) will automatically imply a too long switch-off duration $T_{OFF}$ (signal $ERR_6$ is set).

Accordingly, it is also sufficient to use only one of the circuits 482$_{ON}$ or 482$_{OFF}$ or, when using both circuits, the blocks 4824, 4828 and 4832 are redundant.

Figure 16:
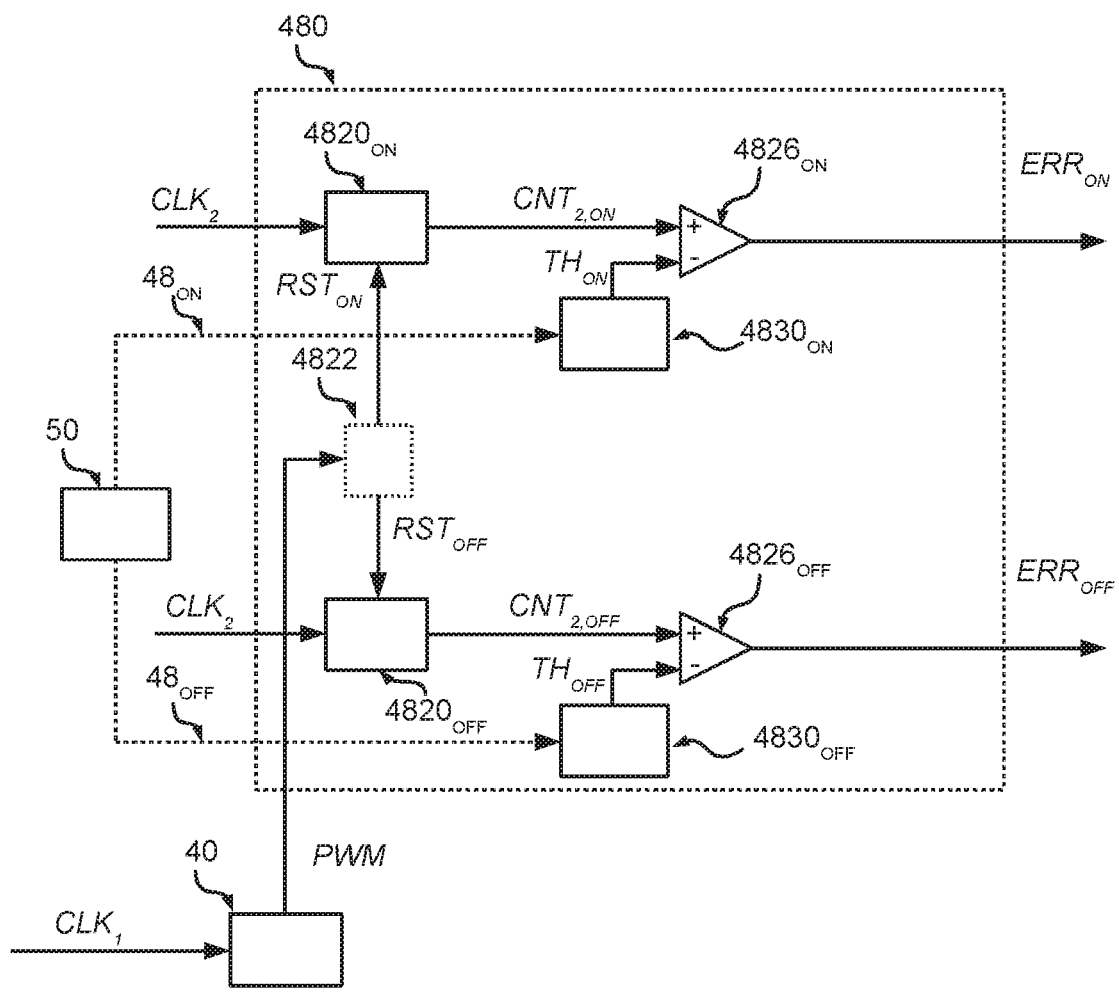
FIG. 16 show a second embodiment of the second sub-circuit of the fault detection circuit of FIG. 8.

In this regards FIG. 16 shows an embodiment of the complete submodule 480 with reduced complexity, in which the blocks 4824, 4828 and 4832 have been removed.

Accordingly, in the embodiment considered, the submodule 480 comprises two counter 4820$_{ON}$ and 4820$_{OFF}$. The first counter 4820$_{ON}$ is enabled when the signal PWM is high and reset when the signal PWM is low. As mentioned in the foregoing, this may be achieved by means of an inverter in the counter reset circuit 4822, i.e., the reset signal $RST_{ON}$ for the counter 4820$_{ON}$ may correspond to the inverted signal PWM. Conversely, the second counter 4820$_{OFF}$ is enabled when the signal PWM is low and reset when the signal PWM is high. As mentioned in the foregoing, this may be achieved by using the signal PWM directly as reset signal $RST_{OFF}$ for the counter 4820$_{OFF}$.

Accordingly, in the embodiment considered, the count value $CNT_{2,ON}$ of the counter 4820$_{ON}$ will be indicative of the switch-on duration $T_{ON}$ and the count value $CNT_{2,OFF}$ of the counter 4820$_{OFF}$ will be indicative of the switch-off duration $T_{OFF}$.

In the embodiment considered, the count value $CNT_{2,ON}$ is compared at a comparator 4826$_{ON}$ with a threshold $TH_{ON}$ in order to determine whether the switch-on duration $T_{ON}$ is too long and the output of the comparator 4826$_{ON}$ is used as error signal $ERR_{ON}$. As mentioned in the forgoing, the threshold $TH_{ON}$ may be stored in a register 4830$_{ON}$, which may be programmable via the module 50 by means of a control signal 48$_{ON}$.

Similarly, the count value $CNT_{OFF}$ may be compared at a comparator 4826$_{OFF}$ with a threshold $TH_{OFF}$ in order to determine whether the switch-off duration $T_{OFF}$ is too long and the output of the comparator 4826$_{OFF}$ may be used as error signal $ERR_{OFF}$. Also in this case, the threshold $TH_{OFF}$ may be stored in a register 4830$_{OFF}$, which may be programmable via the module 50 by means of a control signal 48$_{OFF}$.

This embodiment does, however, not take into account that indeed only one of the counters 4820$_{ON}$ or 4820$_{OFF}$ will be enabled at a given time.

Accordingly, indeed a single counter may be used for the submodule 480.

Figure 17:
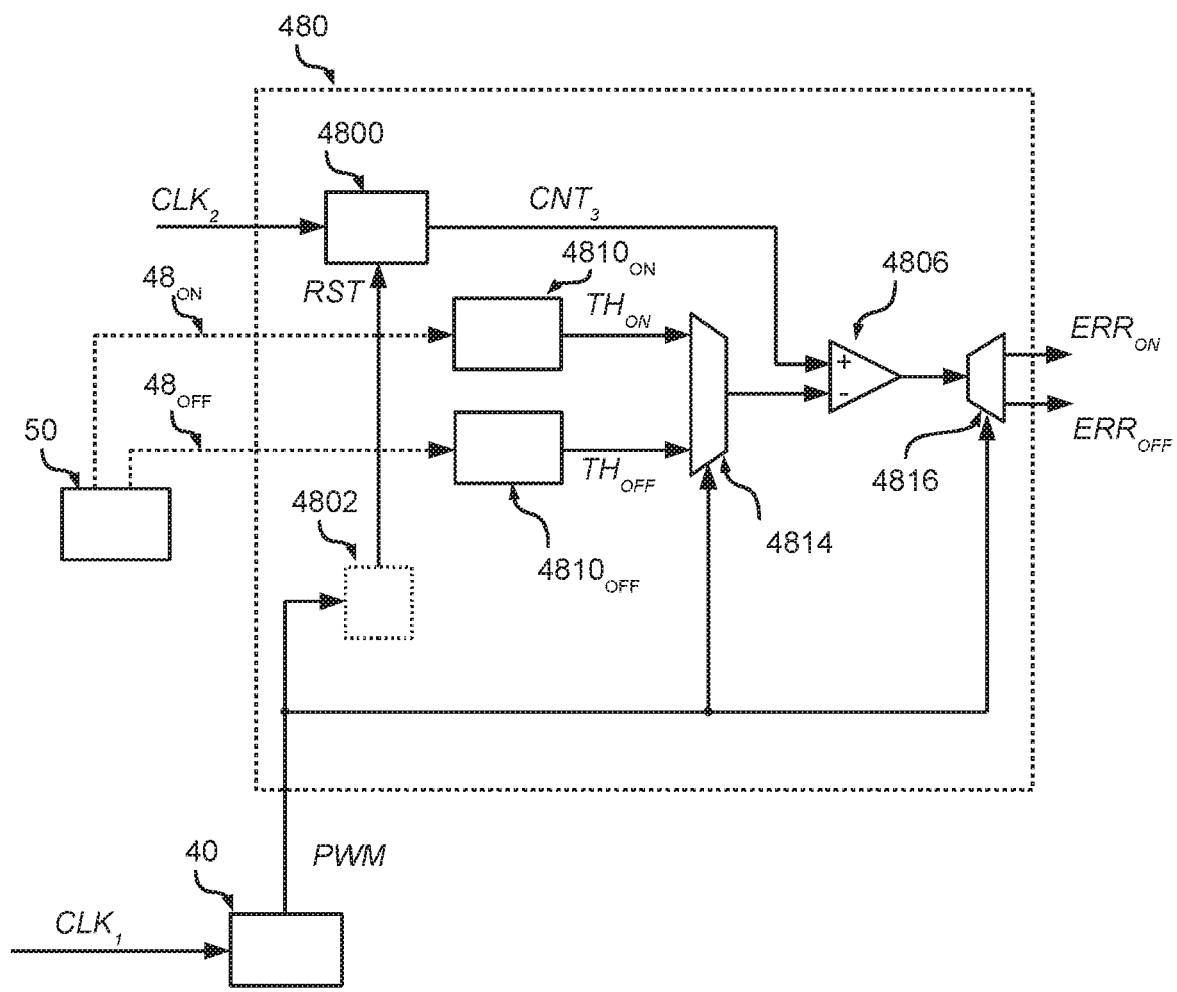
FIG. 17 show a third embodiment of the second sub-circuit of the fault detection circuit of FIG. 8.

FIG. 17 shows a first embodiment of the submodule 480 with a single counter 4800.

Specifically, in the embodiment considered, the counter 4800 is configured to reset a count value $CNT_3$ in response to a reset signal RST. Specifically, this reset signal RST is generated by a counter reset circuit 4802 at each rising edge and at each falling edge of the signal PWM. Accordingly, the counter 4802 varies (increases or decreases based on the counter used) the count value $CNT_3$ until a new rising or falling edge occurs in the signal PWM.

In the embodiment considered, the count value $CNT_3$ is provided to a comparator 4806. Specifically, this comparator 4806 is configured to compare, as a function of the value of the signal PWM, the count value $CNT_3$ either with a switch-on threshold $TH_{ON}$ (signal PWM is high) or a switch-off threshold $TH_{OFF}$ (signal PWM is low). For example, in the embodiment considered, the selection is performed by means of a multiplexer 4814. Again, these thresholds may be stored in respective registers 4810$_{ON}$ and 48$_{OFF}$, which may be programmable via the module 50 by means of control signals 48$_{ON}$ and 48$_{OFF}$.

Accordingly, when the signal PWM is high, the count value $CNT_3$ is indicative for the switch-on duration $T_{ON}$ and the comparator 4806 indicates whether the switch-on duration $T_{ON}$ is too long, e.g., greater than the threshold $TH_{ON}$. Conversely, when the signal PWM is low, the count value $CNT_3$ is indicative for the switch-off duration $T_{OFF}$ and the comparator 4806 indicates whether the switch-off duration $T_{OFF}$ is too long, e.g., greater than the threshold $TH_{OFF}$. Accordingly, a simple de-multiplexer 4816 receiving at input the comparison signal provided by the comparator 4806 and driven by means of the signal PWM may be used in order to generate respective error signal $ERR_{ON}$ and $ERR_{OFF}$ indicating whether the switch-on duration $T_{ON}$ or switch-off duration $T_{OFF}$ are too long, respectively.

Figure 18:
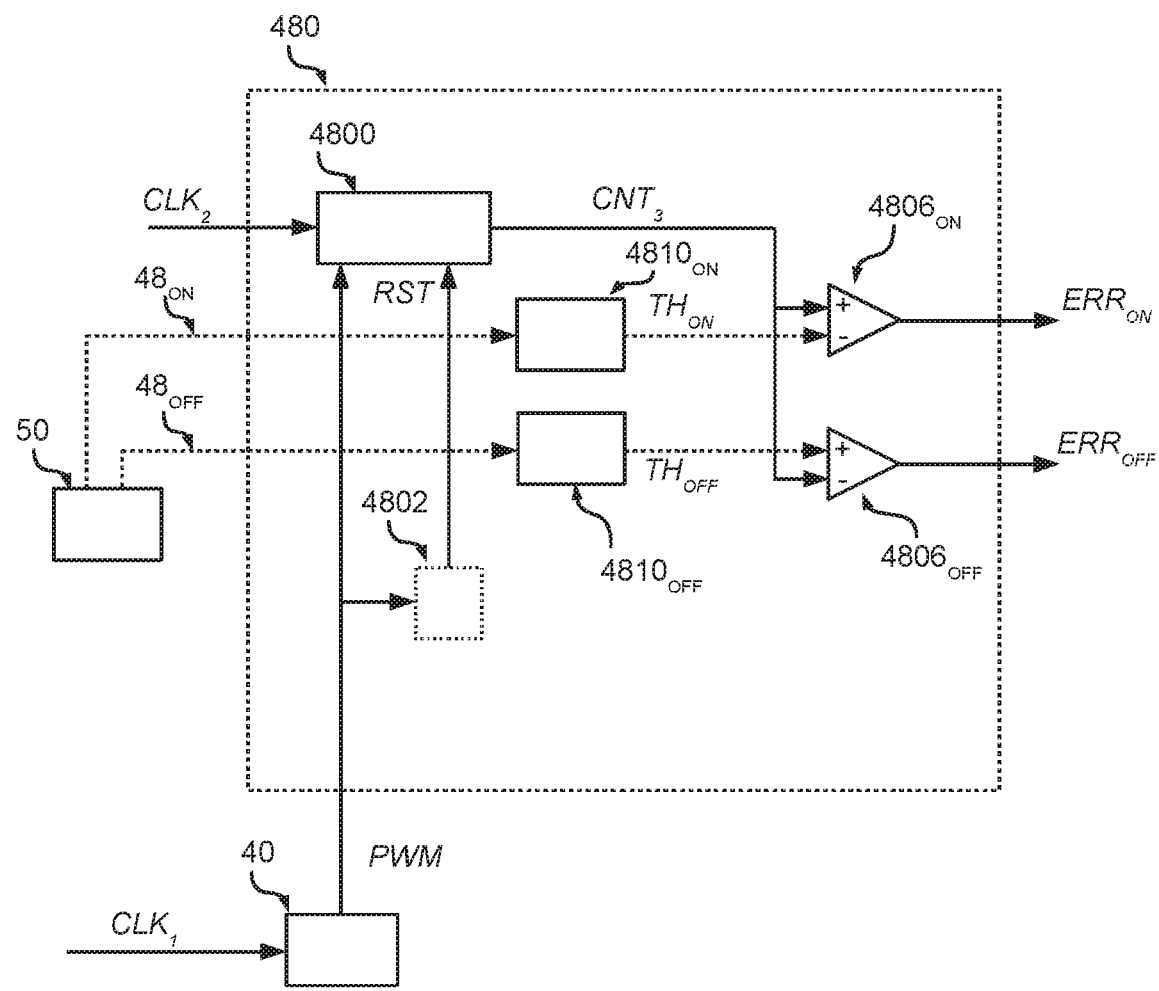
FIGS. 18 and 19 show a fourth embodiment of the second sub-circuit of the fault detection circuit of FIG. 8.

FIG. 18 shows an alternative embodiment of the submodule 480 wherein an up-and-down counter 4800 is used, thereby avoiding the need for multiplexers and de-multiplexers.

Specifically, in the embodiment considered, the counter 4800 is configured to reset a count value $CNT_3$ in response to a reset signal RST. Specifically, this reset signal RST is generated by a counter reset circuit 4802 at each rising and each falling edge of the signal PWM. Accordingly, the counter 4800 varies (increases or decreases based on a selection signal) the count value $CNT_3$ until a new rising of failing edge in the signal PWM occurs. Specifically, the counter 4800 is configure to increase or decreases the count value $CNT_3$ as a function of the value of the signal PWM. For example, in the embodiment considered, the count value CNT₃ is increased when the signal PWM is high and the count value $CNT_3$ is decreased when the signal PWM is low.

In the embodiment considered, the count value $CNT_3$ is provided to two comparators $4806_{ON}$ and $4806_{OFF}$.

Specifically, the comparator $4806_{ON}$ is configured to compare the count value $CNT_3$ with a switch-on threshold $TH_{ON}$, and the comparator $4806_{OFF}$ is configured to compare the count value $CNT_3$ with a switch-off threshold $TH_{OFF}$.

Accordingly, as shown in FIG. 18, when the signal PWM is high, the count value $CNT_3$ may have a positive value being indicative of the switch-on duration $T_{ON}$ and the comparator $4800_{ON}$ indicates whether the switch-on duration $T_{ON}$ is too long, i.e., greater than the threshold $TH_{ON}$ being set to a positive value. Conversely, when the signal PWM is low, the count value $CNT_3$ may have a negative value being indicative of the switch-off duration $T_{OFF}$ and the comparator $4806_{OFF}$ indicates whether the switch-off duration $T_{OFF}$ is too long, i.e., smaller than the threshold $TH_{OFF}$ being set usually to a negative value. Accordingly, in the embodiment considered, the outputs of the comparators $4806_{ON}$ and $4806_{OFF}$ may be used as error signal $ERR_{ON}$ and $ERR_{OFF}$ indicating whether the switch-on duration $T_{ON}$ or switch-off duration $T_{OFF}$ are too long, respectively.

Accordingly, in the embodiment considered, the counter reset circuit 4802 detects the logic level of the signal PWM and, on each logic level change, it resets the counter 4800. Moreover, the signal PWM indicates whether the counter 4800 has to operate as an up-counter or a down-counter, e.g., the counter 4800 may count up if the logic level of the signal PWM is high and count down if the logic level of the signal PWM is low.

Figure 19:
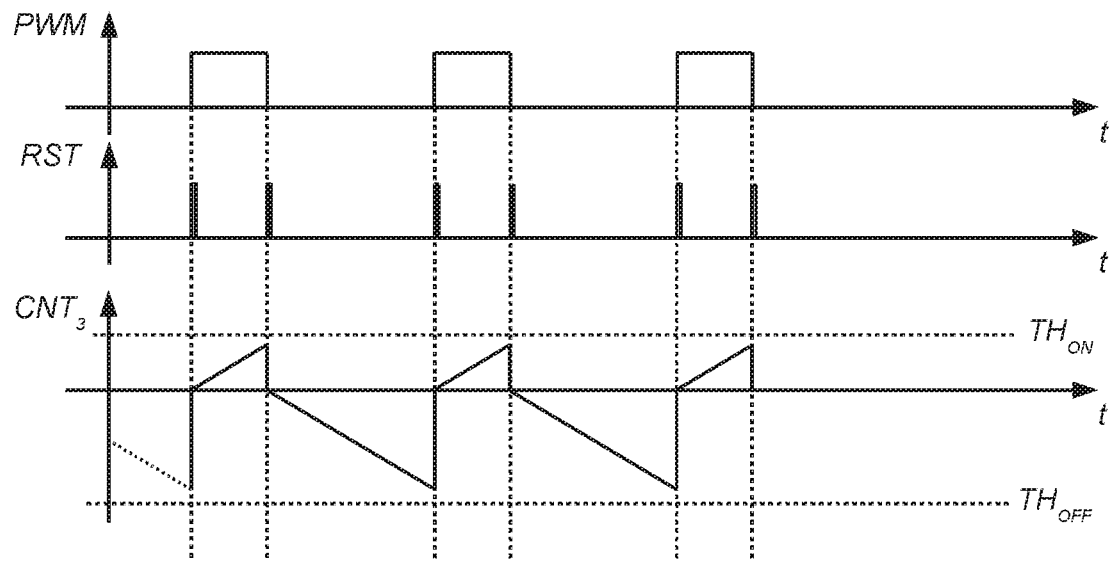

As result, in case of correct operation, the counter 4800 counts as shown in the FIG. 19. If the duration of the switch-on time $T_{ON}$ of the PWM signal is longer than the expected one, the comparator $4806_{ON}$ output changes and a failure is signaled via the signal $ERR_{ON}$. Conversely, if the duration of the switch-off time $T_{OFF}$ of the PWM signal is longer than the expected one, the comparator $4806_{OFF}$ output changes and a failure is signaled via the signal $ERR_{OFF}$.

The setting of the thresholds $TH_{ON}$ and $TH_{OFF}$ is performed in time by the module 50 by means of control signal $48_{ON}$ and $48_{OFF}$, e.g., when the PWM configuration parameters 42 change and/or at the being of a new PWM period. As mentioned in the foregoing, preferably these thresholds are determined as a function of the PWM configuration parameters 42.

Generally, the proper selection of the thresholds $TH_{ON}$ and $TH_{OFF}$ is application dependent. For example, in case the counter 4800 behaves as an up-counter when the signal PWM is high, the module 50 may use the following relations:

$$TH_{ON}=C_{RES,UP}+(C_{PWM\_ON,N}+X_3) \qquad (6)$$

$$TH_{OFF}=C_{RES,DOWN}-(C_{PWM\_OFF1,N}+C_{PWM\_OFF1,N-1}+X_4) \qquad (7)$$

where $C_{RES,UP}$ and $C_{RES,DOWN}$ are the reset values of the counter 4800 when operating as up-counter or down-counter, respectively, $C_{PWM\_ON,N}$, $C_{PWM\_OFF1,N}$ and $C_{PWM\_OFF2,N-1}$ are respectively the switch-on time $T_{ON}$ of the PWM period N, the initial off-time $T_{OFF1}$ of the PWM period N and the final off-time $T_{OFF2}$ of the PWM period N−1 in number of clock cycle of the clock signal $CLK_2$, and $X_3$ and $X_4$ are one or more clock cycle of the same clock representing the accepted tolerance.

Similarly, in case the counter 4800 behaves as a down-counter when the signal PWM is high, the module 50 may use the following relations:

$$TH_{ON}=C_{RES,DOWN}-(C_{PWM\_ON,N}+X_3) \qquad (8)$$

$$TH_{OFF}=C_{RES,UP}+(C_{PWM\_OFF1,N}+C_{PWM\_OFF1,N-1}+X_4) \qquad (9)$$

In this case, however, also the inputs of the comparators 4604 and 4606 have to be switched, i.e., the comparator 4604 indicates an error when the count value $CNT_3$ is smaller than the threshold $TH_{ON}$ and the comparator 4606 indicates an error when the count value $CNT_3$ is greater than the threshold $TH_{OFF}$.

In various embodiments, once having detected an error, the sub-circuit 480 may store the values of the error signals $ERR_{ON}$ and/or $ERR_{OFF}$ in a memory, such as register or flip-flop. For example, in various embodiments, each error signal is connected to the set input of a set-reset flip-flop or latch.

Thus, generally, the sub-circuit 480 determines a count value being indicative of the switch-on duration $T_{ON}$ and a count value being indicative of the switch-off duration $T_{OFF}$. For example, the same counter 4800 is used for this purpose in the embodiments shown in FIGS. 17 and 18, Next, the sub-circuit 480 compares the count value being indicative of the switch-on duration $T_{ON}$ with a switch-on threshold $TH_{ON}$ in order to determine whether the switch-on duration $T_{ON}$ is greater than a maximum switch-on duration. As mentioned in the foregoing, based on the operation of the counter, the comparison may indeed determine at the circuit level whether the count value is smaller than a maximum threshold value. However, this comparison still determines whether the switch-on duration $T_{ON}$ is greater than a maximum switch-on duration, and possibly generates an error signal $ERR_{ON}$ when the switch-on duration $T_{ON}$ is greater than the maximum switch-on duration.

Similarly, the sub-circuit 460 compares the value being indicative of the switch-off duration with a switch-off threshold $TH_{OFF}$ in order to determine whether the switch-off duration $T_{OFF}$ is greater than a maximum switch-off duration, and possibly generates an error signal $ERR_{OFF}$ when the switch-off duration $T_{OFF}$ is greater than the maximum switch-off duration.

The solutions disclosed herein have thus significant advantages with respect to the known solutions. In fact, similar to the read-back method shown in FIG. 7, the fault detection circuit 460 operates with the real PWM signal, permitting thus a monitoring also of high-power PWM signals. However, the solution directly detects possible PWM failures at most at the end of the PWM cycle, without affecting significantly the overall device size.

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A method for detecting a fault in a pulse width modulated (PWM) signal, the method comprising:
    generating a counter signal corresponding to a period of the PWM signal, wherein a magnitude of the counter signal varies from an initial value at a beginning of the period of the PWM signal until an ending of the period of the PWM signal; and determining whether the magnitude of the counter signal at the ending of the period of the PWM signal is within a first threshold and a second threshold and, based thereon, generating an error signal indicating a fault condition status corresponding to the period of the PWM signal.

2. The method of claim 1, further comprising resetting the magnitude of the counter signal at the beginning of the period of the PWM signal to the initial value.

3. The method of claim 2, wherein an absolute value of the magnitude of the counter signal is increasing before the resetting.

4. The method of claim 1, further comprising storing the first threshold and the second threshold in a programmable memory.

5. The method of claim 1, wherein the error signal further indicates whether the period of the PWM signal is greater than or shorter than an expected period of the PWM signal.

6. The method of claim 1, further comprising storing the error signal in a programmable memory.

7. The method of claim 1, wherein a respective value of the first threshold and the second threshold varies in accordance with a clock cycle of the PWM signal.

8. A circuit to detect a fault condition in a pulse width modulated (PWM) signal, the circuit comprising:
a digital counter configured to generate a counter signal corresponding to a period of the PWM signal, wherein a magnitude of the counter signal varies from an initial value at a beginning of the period of the PWM signal until an ending of the period of the PWM signal; and
a comparator circuit configured to determine whether the magnitude of the counter signal at the ending of the period of the PWM signal is greater than a threshold and, based thereon, generate an error signal indicating that the period of the PWM signal is longer than an expected period of the PWM signal.

9. The circuit of claim 8, further comprising:
a counter reset circuit configured to reset the magnitude of the counter signal to the initial value by generating a reset signal at the beginning of the period of the PWM signal;
a second comparator circuit configured to generate a comparison signal indicating whether the magnitude of the counter signal is greater than or less than a second threshold; and
a verification circuit configured to:
receive the reset signal from the counter reset circuit and receive the comparison signal from the second comparator circuit; and
determine, after receiving the reset signal, whether the comparison signal indicates that the magnitude of the counter signal is less than the second threshold and, based thereon, generating an error signal indicating that the period of the PWM signal is shorter than the expected period of the PWM signal.

10. The circuit of claim 9, further comprising a memory configured to store each threshold value and each error signal.

11. The circuit of claim 10, wherein the memory is a register, a flip-flop, or a combination thereof.

12. The circuit of claim 9, wherein a respective value of each threshold varies in accordance with a clock cycle of the PWM signal.

13. The circuit of claim 8, further comprising a counter reset circuit configured to reset the magnitude of the counter signal to the initial value by generating a reset signal at the beginning of the period of the PWM signal.

14. The circuit of claim 8, wherein an absolute value of the magnitude of the counter signal is increasing before being reset.

15. A system comprising:
a pulse width modulated (PWM) driver configured to generate a PWM signal;
a fault detection circuit configured to detect a fault condition in the PWM signal, the fault detection circuit comprising:
a digital counter configured to generate a counter signal corresponding to a period of the PWM signal, wherein a magnitude of the counter signal varies from an initial value at a beginning of the period of the PWM signal until an ending of the period of the PWM signal; and
a comparator circuit configured to determine whether the magnitude of the counter signal at the ending of the period of the PWM signal is greater than a threshold and, based thereon, generate an error signal indicating that the period of the PWM signal is longer than an expected period of the PWM signal.

16. The system of claim 15, wherein the fault detection circuit further comprises:
a counter reset circuit configured to reset the magnitude of the counter signal to the initial value by generating a reset signal at the beginning of the period of the PWM signal;
a second comparator circuit configured to generate a comparison signal indicating whether the magnitude of the counter signal is greater than or less than a second threshold; and
a verification circuit configured to:
receive the reset signal from the counter reset circuit and receive the comparison signal from the second comparator circuit; and
determine, after receiving the reset signal, whether the comparison signal indicates that the magnitude of the counter signal is less than the second threshold and, based thereon, generating an error signal indicating that the period of the PWM signal is shorter than the expected period of the PWM signal.

17. The system of claim 16, wherein a respective value of each threshold varies in accordance with a clock cycle of the PWM signal.

18. The system of claim 16, wherein the fault detection circuit further comprises a memory configured to store each threshold value and each error signal.

19. The system of claim 18, wherein the memory is a register, a flip-flop, or a combination thereof.

20. The system of claim 15, wherein the fault detection circuit further comprises a counter reset circuit configured to reset the magnitude of the counter signal to the initial value by generating a reset signal at the beginning of the period of the PWM signal.

21. The system of claim 15, further comprising a control unit configured to generate a control signal, wherein the PWM driver is further configured to receive the control signal and to generate the PWM signal as a function of the control signal.

\* \* \* \* \*